(12) United States Patent
Otomo

(10) Patent No.: US 11,728,231 B2
(45) Date of Patent: Aug. 15, 2023

(54) SEMICONDUCTOR MODULE

(71) Applicant: FUJI ELECTRIC CO., LTD., Kanagawa (JP)

(72) Inventor: Yoshinori Otomo, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 127 days.

(21) Appl. No.: 17/486,990

(22) Filed: Sep. 28, 2021

(65) Prior Publication Data
US 2022/0157675 A1     May 19, 2022

(30) Foreign Application Priority Data

Nov. 17, 2020    (JP) ................................. 2020-190941

(51) Int. Cl.
| | |
|---|---|
| *H01L 25/07* | (2006.01) |
| *H01L 23/14* | (2006.01) |
| *H01L 23/40* | (2006.01) |
| *H01L 23/00* | (2006.01) |
| *H05K 1/02* | (2006.01) |
| *H01L 21/56* | (2006.01) |

(52) U.S. Cl.
CPC .......... *H01L 23/142* (2013.01); *H01L 21/565* (2013.01); *H01L 23/40* (2013.01); *H01L 24/48* (2013.01); *H01L 24/73* (2013.01); *H01L 25/07* (2013.01); *H05K 1/0271* (2013.01); *H01L 2224/32225* (2013.01); *H01L 2224/48139* (2013.01); *H01L 2224/48227* (2013.01); *H01L 2224/73265* (2013.01)

(58) Field of Classification Search
CPC ..... H01L 23/142; H01L 21/565; H01L 23/40; H01L 24/48; H01L 24/73; H01L 25/07; H01L 2224/32225; H01L 2224/48139; H01L 2224/48227; H01L 2224/73265; H01L 23/3107; H01L 23/15; H01L 23/367; H01L 23/3735; H01L 23/562; H05K 1/0271; H05K 2201/10204
See application file for complete search history.

(56) References Cited

FOREIGN PATENT DOCUMENTS

| | | |
|---|---|---|
| JP | H10199900 A | 7/1998 |
| JP | 2019192739 A | 10/2019 |

*Primary Examiner* — Elias Ullah

(57) ABSTRACT

Provided is a semiconductor module including: an insulating circuit board that includes an insulating board and a conductive circuit pattern provided on an upper surface of the insulating board; a semiconductor chip that is provided above the insulating circuit board; a solder portion that bonds the circuit pattern and the semiconductor chip; and one or more temperature gradient adjustment portions configured to be bonded to the insulating circuit board and have at least one surface disposed to face at least one surface of the solder portion. The insulating circuit board is warped in a first direction. At least one of the temperature gradient adjustment portions is disposed at a place where an amount of warpage of the insulating circuit board in the first direction is smaller than an average amount of warpage of the insulating circuit board in the first direction.

20 Claims, 9 Drawing Sheets

A-A

A-A

SEMICONDUCTOR MODULE

The contents of the following Japanese patent application are incorporated herein by reference:
NO. 2020-190941 filed in JP on Nov. 17, 2020.

BACKGROUND

1. Technical Field

The present invention relates to a semiconductor module.

2. Related Art

Conventionally, a semiconductor module in which a semiconductor chip and a circuit pattern are bonded by a solder portion is known. (For example, see Patent Literature 1).
Patent Literature 1: Japanese Patent Application Publication No. 2019-192739
In a semiconductor module, it is preferable to reduce a solder flow from which a solder portion flows out.

SUMMARY

In order to solve the above problems, a first aspect of the present invention provides a semiconductor module. The semiconductor module may include an insulating circuit board. The insulating circuit board may include an insulating board and a conductive circuit pattern provided on an upper surface of the insulating board. The semiconductor module may include a semiconductor chip. The semiconductor chip may be provided above the insulating circuit board. The semiconductor module may include a solder portion. The solder portion may bond the circuit pattern and the semiconductor chip. The semiconductor module may include one or more temperature gradient adjustment portions. The temperature gradient adjustment portion may be bonded to the insulating circuit board. At least one surface of the temperature gradient adjustment portion may be disposed to face at least one surface of the solder portion. The insulating circuit board may be warped in a first direction. At least one temperature gradient adjustment portion may be disposed at a place where the amount of warpage of the insulating circuit board in the first direction is smaller than the average of the amounts of warpage of the insulating circuit board 41 in the first direction.

Note that the above summary of the invention does not enumerate all of the features of the present invention. Further, a sub-combination of these feature groups can also be an invention.

DESCRIPTION OF EXEMPLARY EMBODIMENTS

Hereinafter, the present invention will be described through embodiments of the invention, but the following embodiments do not limit the invention according to the claims. In addition, not all combinations of features described in the embodiments are essential to the solution of the invention.

Figure 1:
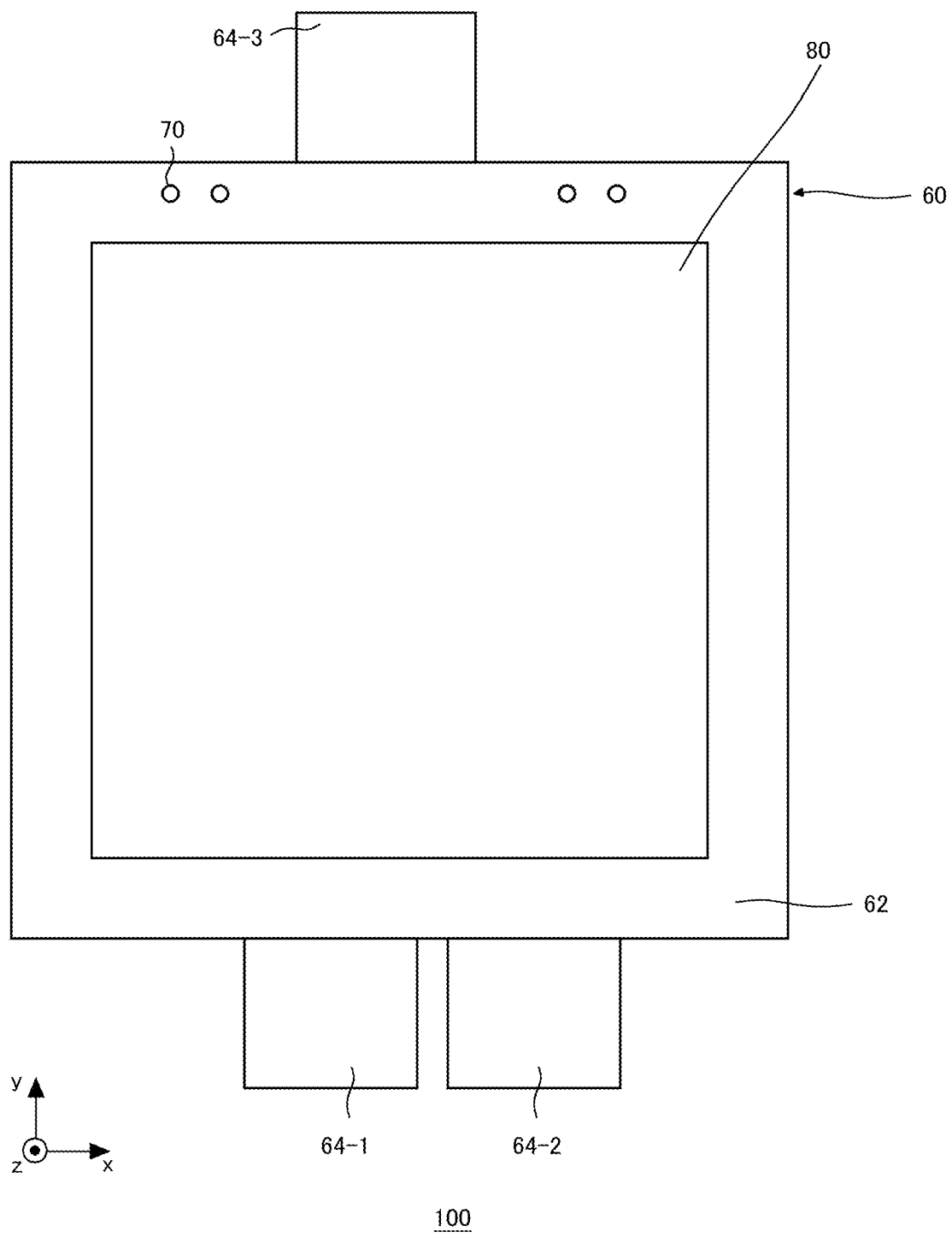
FIG. 1 is a diagram illustrating an example of a semiconductor module 100 according to an embodiment of the present invention.
Figure 2:
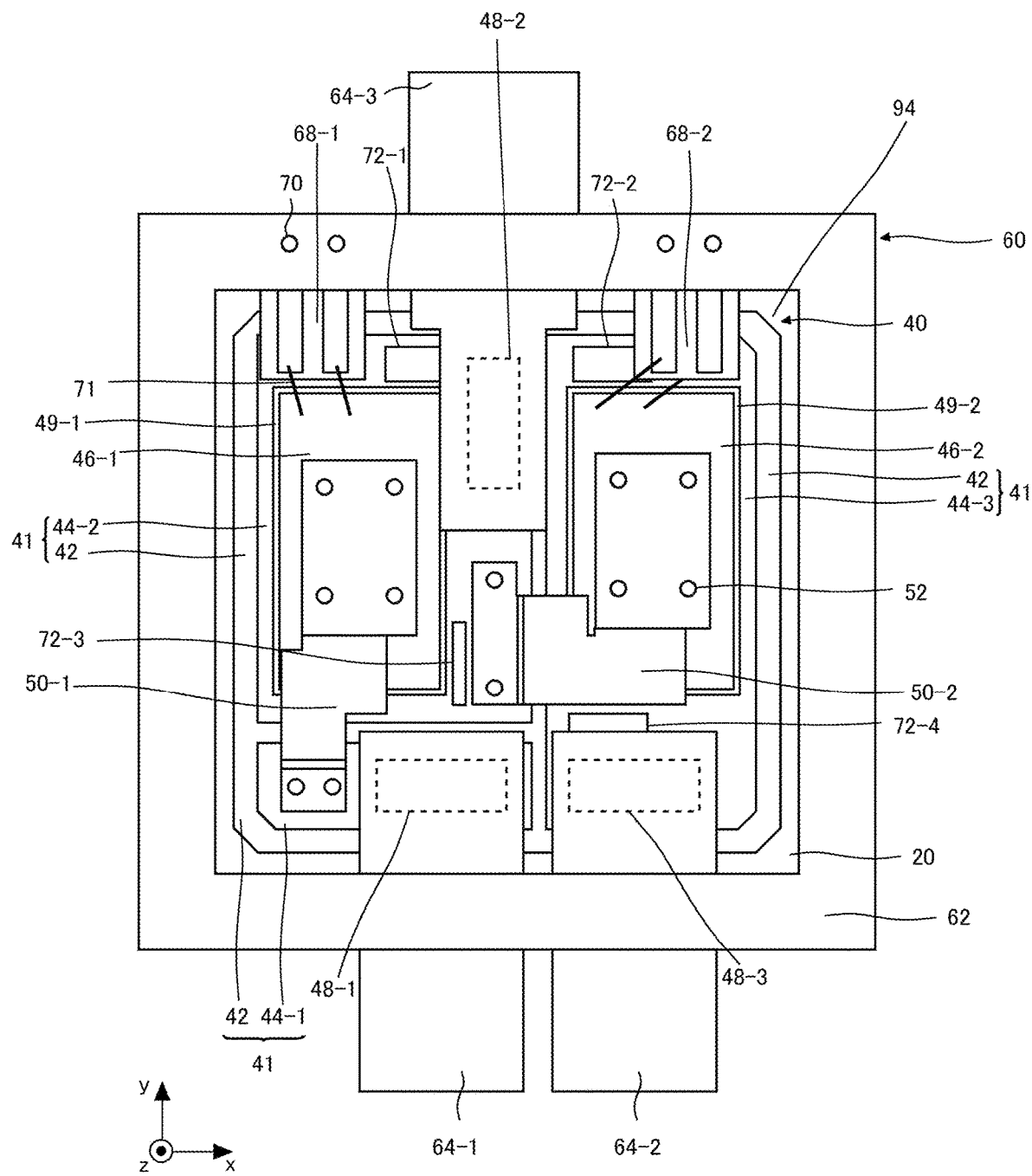
FIG. 2 is a diagram illustrating an internal configuration of the semiconductor module 100.

FIG. 1 is a diagram illustrating an example of a semiconductor module 100 according to an embodiment of the present invention. FIG. 2 is a diagram illustrating an internal configuration of the semiconductor module 100. Specifically, FIG. 2 is a diagram in which a sealing resin 80 is removed from the semiconductor module 100 of FIG. 1. The sealing resin 80 may be injected into a resin case 62 and surrounded by the resin case 62.

As illustrated in FIG. 2, the semiconductor module 100 includes a cooling plate 20, a power cell 40, and a terminal case 60. The power cell 40 of this example is placed on the cooling plate 20. In the present specification, a plane of the cooling plate 20 on which the power cell 40 is placed is defined as an xy plane, and a plane perpendicular to the xy plane is defined as a z axis. In the present specification, a direction from the cooling plate 20 toward the power cell 40 in the z-axis direction is referred to as upward, and the opposite direction is referred to as downward, but the upward and downward directions are not limited to the gravity direction. In the present specification, among the surfaces of each member, a surface on the upper side is referred to as an upper surface, and a surface on the lower side is referred to as a lower surface.

In the present specification, viewing from the z-axis direction is referred to as a top view. That is, a diagram in a top view is a diagram in which the position of each member is projected on the xy plane. FIG. 1 and FIG. 2 illustrate the semiconductor module 100 in a top view.

The semiconductor module 100 of this example includes the power cell 40 in which a circuit constituting an arm or the like of an inverter circuit is formed. The power cell 40 includes an insulating circuit board 41, a semiconductor chip 46, a conductive block 48, a solder portion 49, a lead frame 50 having a plurality of protrusions 52, and a temperature gradient adjustment portion 72. The insulating circuit board 41 may include an insulating board 42 and a circuit pattern 44. In particular, the insulating circuit board 41 may have a heat releasing board made of copper or the like on the back surface of the insulating board 42, that is, the side placed on the cooling plate 20.

In FIG. 2, the position of the conductive block 48 is indicated by a dotted line. One or more semiconductor chips 46 are placed on the power cell 40. In this example, a semiconductor chip 46-1 and a semiconductor chip 46-2 are placed on the power cell 40.

The semiconductor chip 46 may include a diode such as an insulated gate bipolar transistor (IGBT) or a free wheel diode (FWD), a reverse conducting (RC)-IGBT obtained by combining these diodes, a MOS transistor, and the like. The semiconductor chip 46 may include a semiconductor element such as a silicon carbide (SiC) or gallium nitrogen (GaN).

The cooling plate 20 may be provided to overlap the lower surface of the insulating circuit board 41. The cooling plate 20 releases Joule heat generated from the semiconductor chip 46 to the outside of the semiconductor module 100. As a result, it is possible to prevent the element of the semiconductor chip 46 from being broken. The cooling plate 20 is made of a metal material such as aluminum. The cooling plate 20 may be a cooler including a cooling fin and the like.

The terminal case 60 is placed on the upper surface of the cooling plate 20. The terminal case 60 includes the resin case 62, a terminal 64, a terminal plate 68, and a control terminal 70. The resin case 62 is provided so as to surround a space 94 accommodating the power cell 40. One or more terminals 64 (64-1, 64-2, and 64-3 in this example) may be provided to be exposed from the resin case 62. In this example, the terminal 64 may extend from the space 94 to the outside of the resin case 62. The terminal 64 may be a plate-like member thinner than the conductive block 48. The terminal 64 may be made of metal. The terminal 64 is electrically connected to the circuit pattern 44 via the conductive block 48. The terminal 64 may be electrically connected to an external electrode. In this example, each of the terminal 64 and the conductive block 48 is a conductive member having conductivity.

A main current flows through the terminal 64. The terminal 64 is, for example, an IN terminal, an OUT terminal, a COM terminal, or the like. Here, the main current is a maximum current among the currents flowing through the semiconductor chip 46. For example, when the semiconductor chip 46 is an IGBT, the main current is a current flowing between the emitter electrode and the collector electrode. When the semiconductor chip 46 is a MOS transistor, the main current is a current flowing between the source electrode and the drain electrode. When the semiconductor chip 46 is a diode, the main current is a current flowing between the anode electrode and the cathode electrode. That is, each of the terminals 64-1, the terminal 64-2, and the terminal 64-3 may be electrically connected to any electrode of the semiconductor chip 46 described above. The main current described above does not include a control current flowing through a control terminal such as a gate electrode of a transistor.

The terminal 64 covers the entire conductive block 48 in a top view. In the example of FIG. 2, the terminal 64-1 covers the entire conductive block 48-1 in a top view. The terminal 64-2 covers the entire conductive block 48-3 in a top view. The terminal 64-3 covers the entire conductive block 48-2 in a top view. Since the terminal 64 covers the entire conductive block 48 in a top view, a contact area between the terminal 64 and the conductive block 48 can be increased.

Further, one or more control terminals 70 may be provided in the resin case 62 so as to be exposed from the terminal case 60. A part of the control terminal 70 is placed on the upper surface of the terminal plate 68. A part of the control terminal 70 is placed on the upper surface of the resin case 62. The control terminal 70 is electrically connected to the control terminal of the semiconductor chip 46 via a wiring 71. A control current flows through the control terminal 70 to control the operation of the semiconductor chip 46.

The terminal case 60 includes a terminal plate 68-1 and a terminal plate 68-2. The control terminal 70 placed on the terminal plate 68-1 is electrically connected to the control terminal of the semiconductor chip 46-1. The control terminal 70 placed on the terminal plate 68-2 is electrically connected to the control terminal of the semiconductor chip 46-2.

In this example, the resin case 62 is formed of a resin such as a thermosetting resin that can be formed by injection molding or an ultraviolet curable resin that can be formed by UV molding. The resin may contain one or a plurality of polymer materials selected from, for example, a polyphenylene sulfide (PPS) resin, a polybutylene terephthalate (PBT) resin, a polyamide (PA) resin, an acrylonitrile butadiene styrene (ABS) resin, an acrylic resin, and the like.

The inside of the resin case 62 is filled with the sealing resin 80 (see FIG. 1). That is, the sealing resin 80 is provided in the space 94. In FIG. 2, the sealing resin 80 is omitted. The sealing resin 80 may contain an epoxy resin. The sealing resin 80 may contain a silicone gel. The sealing resin 80 may be not limited to an epoxy resin or a silicone gel. The power cell 40 can be protected by the sealing resin 80.

Figure 3:
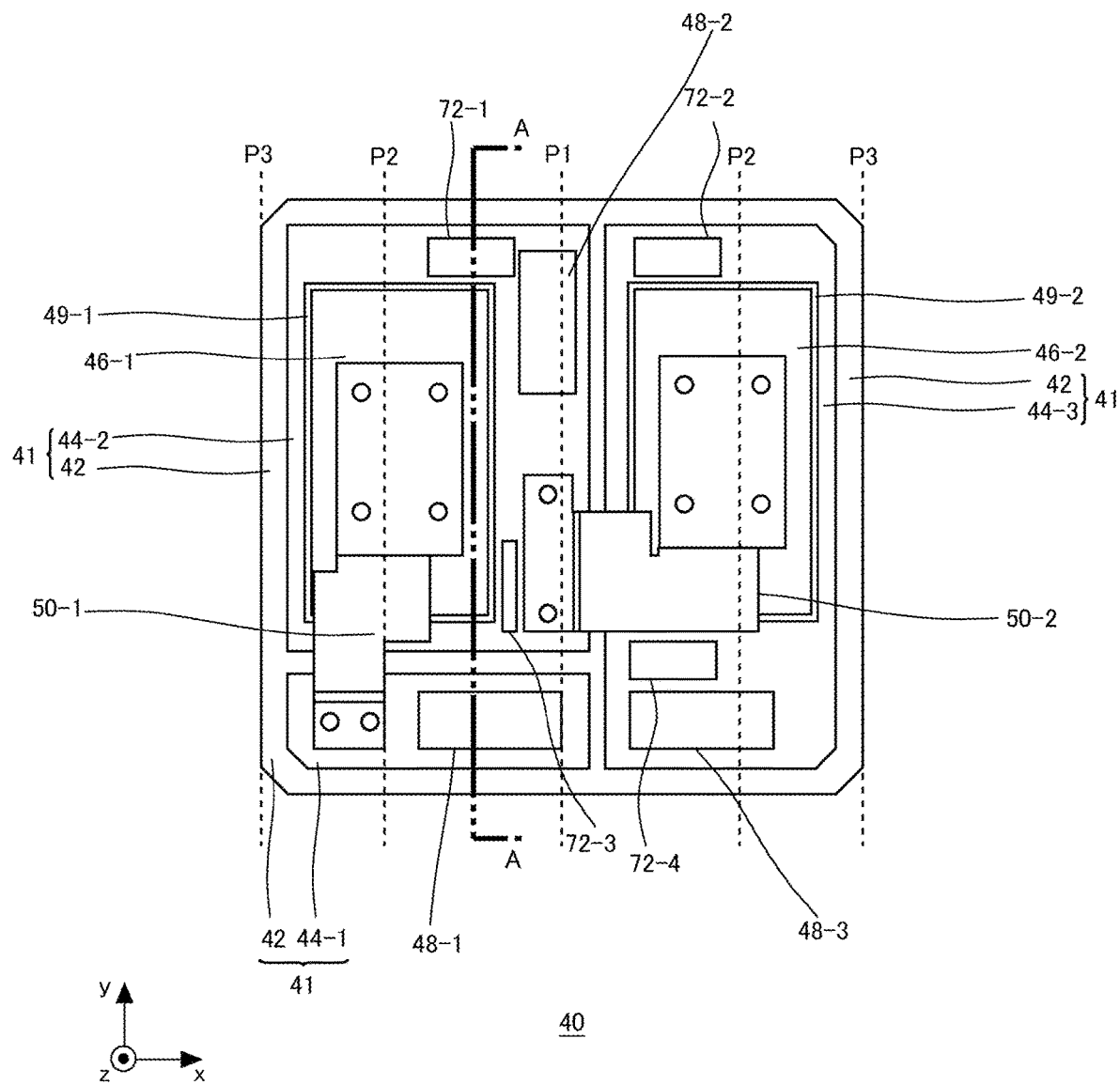
FIG. 3 is a diagram illustrating an example of a power cell 40 in a top view.

FIG. 3 is a diagram illustrating an example of the power cell 40 in a top view. The power cell 40 includes the insulating board 42, the circuit pattern 44, the semiconductor chip 46, the conductive block 48, the solder portion 49, the lead frame 50, and the temperature gradient adjustment portion 72. The insulating board 42 may be formed of silicon nitride ceramics, aluminum nitride ceramics, or the like. The temperature gradient adjustment portion 72 is bonded to the insulating circuit board 41 to relax the temperature gradient of the circuit pattern 44. In this example, the temperature gradient adjustment portion 72 is bonded to the circuit pattern 44, but may be bonded to the insulating board 42.

The circuit pattern 44 may be provided on the upper surface of the insulating board 42. In this example, the insulating board 42 is provided with a circuit pattern 44-1, a circuit pattern 44-2, and a circuit pattern 44-3. The circuit pattern 44 may include copper. The circuit pattern 44 may be a copper plate, an aluminum plate, or a plate obtained by plating these materials. The circuit pattern 44 may be directly bonded to the insulating board 42, or may be bonded to the insulating board 42 via a brazing material or the like.

The circuit pattern 44 may be electrically connected to the semiconductor chip 46, the conductive block 48, the solder portion 49, or the lead frame 50. The circuit pattern 44 has conductivity. In the example of FIG. 3, the conductive block 48-1 and a lead frame 50-1 are placed on the circuit pattern 44-1 and electrically connected to each other. The semiconductor chip 46-1 (solder portion 49-1), the conductive block 48-2, a lead frame 50-2, a temperature gradient adjustment portion 72-1, and a temperature gradient adjustment portion 72-3 are placed on the circuit pattern 44-2. The semiconductor chip 46-2 (solder portion 49-2), a conductive block 48-3, a temperature gradient adjustment portion 72-2, and a temperature gradient adjustment portion 72-4 are placed on the circuit pattern 44-3.

Note that the temperature gradient adjustment portion 72 may not constitute a part of circuit wiring for constituting an arm or the like of the inverter circuit. The term "not constitute a part of circuit wiring" means that it does not constitute a part of an essential current path. That is, the temperature gradient adjustment portion 72 may be bonded onto the circuit pattern 44 without performing a function as a current path. The temperature gradient adjustment portion 72 may be electrically connected to the circuit pattern 44 and the circuit wiring. In this case, it is not denied that the temperature gradient adjustment portion 72 functions as a capacity. The temperature gradient adjustment portion 72 may not be electrically connected to the circuit pattern 44 and the circuit wiring.

The semiconductor chip 46 of this example is a vertical chip in which electrodes (for example, an emitter electrode and a collector electrode) are formed on an upper surface and a lower surface. The semiconductor chip 46 may be provided above the insulating circuit board 41. The semiconductor chip 46 is connected to the circuit pattern 44 by an electrode formed on the lower surface, and is connected to the lead frame 50 by an electrode formed on the upper surface. In this example, the semiconductor chip 46-1 is electrically connected to the circuit pattern 44-2 on the lower surface, and is electrically connected to the lead frame 50-1 on the upper surface. In addition, the semiconductor chip 46-2 is electrically connected to the circuit pattern 44-3 on the lower surface, and is electrically connected to the lead frame 50-2 on the upper surface. Note that the semiconductor chip 46 is not limited to a vertical chip. The semiconductor chip 46 may have an electrode electrically connected to the circuit pattern 44 on the upper surface. In this case, the circuit pattern 44 and the electrode may be connected by a wire or the like.

The conductive block 48 electrically connects the circuit pattern 44 and the terminal 64. The conductive block 48 may be provided above the insulating circuit board 41. The conductive block 48 may be placed on the circuit pattern 44. In this example, the conductive block 48-1 is placed on the circuit pattern 44-1, the conductive block 48-2 is placed on the circuit pattern 44-2, and the conductive block 48-3 is placed on the circuit pattern 44-3. The conductive block 48 may be formed of a metal material such as copper. The conductive block 48 may be fixed to the circuit pattern 44 in a reflow furnace or the like.

The lead frame 50 connects the semiconductor chip 46 to the circuit pattern 44. In this example, the lead frame 50-1 connects the semiconductor chip 46-1 to the circuit pattern 44-1. In addition, the lead frame 50-2 connects the semiconductor chip 46-2 to the circuit pattern 44-2. The lead frame 50 is a member formed of a metal material such as copper or aluminum. At least a part of the surface of the lead frame 50 may be plated with nickel or the like. Further, at least a part of the surface of the lead frame 50 may be coated with resin or the like. The lead frame 50 may have a plate-shaped portion. The plate shape refers to a shape in which the areas of two main surfaces disposed opposite to each other are larger than the areas of the other surfaces. At least a portion of the lead frame 50 connected to the semiconductor chip 46 may have a plate shape. The lead frame 50 may be formed by bending one metal plate. The lead frame 50 may be formed by pressing a copper plate. The lead frame 50 may be formed by punching.

The solder portion 49 bonds the circuit pattern 44 and the semiconductor chip 46. In this example, the solder portion 49-1 bonds the circuit pattern 44-2 and the semiconductor chip 46-1. In addition, the solder portion 49-2 bonds the circuit pattern 44-3 and the semiconductor chip 46-2. In a case where the semiconductor chip 46 is bonded to the surface of the circuit pattern 44 via the solder portion 49, heating is performed by a heat treatment device such as a reflow furnace.

Figure 4:
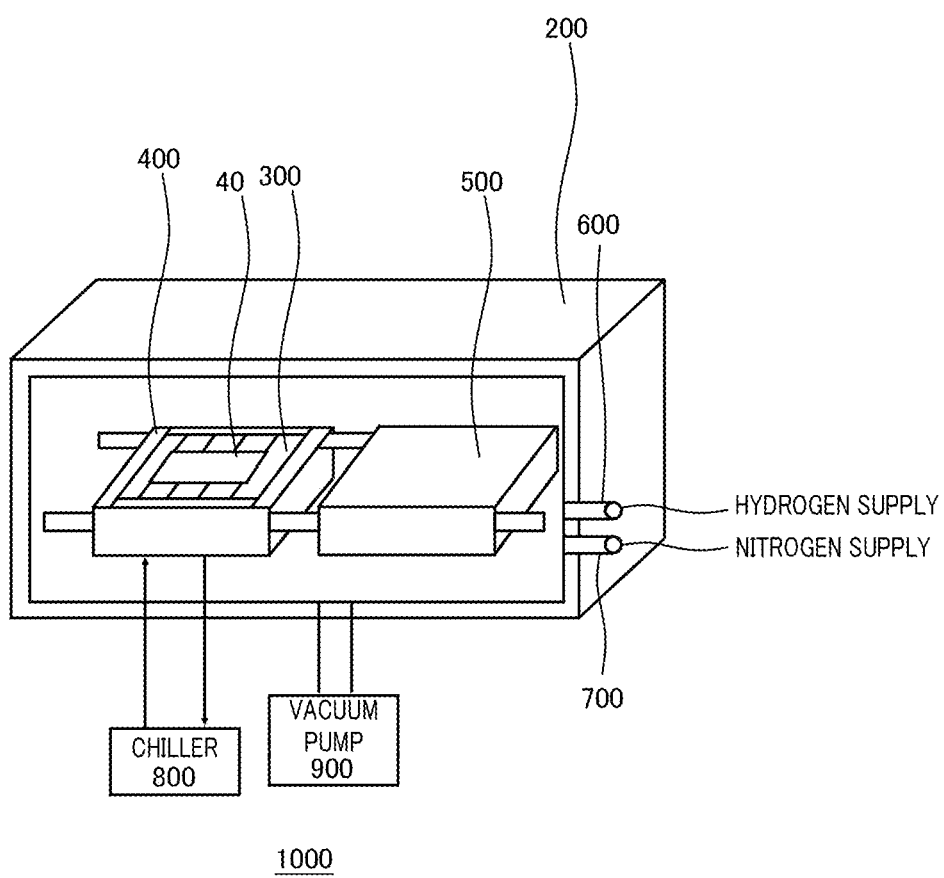
FIG. 4 is a diagram illustrating an example of a heat treatment device 1000.

FIG. 4 is a diagram illustrating an example of a heat treatment device 1000. In this example, the heat treatment device 1000 is a reflow furnace. The heat treatment device 1000 includes a decompression furnace 200, a conveyance stage 300, a cooling plate 400, a heating plate 500, a supply pipe 600, a supply pipe 700, a chiller 800, and a vacuum pump 900. The heat treatment device 1000 performs heat treatment on the power cell 40.

When the heat treatment in the heat treatment device 1000 is started, the vacuum pump 900 decompresses the decompression furnace 200. When the degree of vacuum in the furnace reaches a predetermined pressure, hydrogen gas is introduced through the supply pipe 600. At the same time, the power cell 40 is placed on the conveyance stage 300 and conveyed to the heating plate 500. Then, the power cell 40 is placed on the heating plate 500 and heated and held for a predetermined time. In a case where the heating and holding for a predetermined time is completed, a predetermined pressure operation, a hydrogen introduction, and a discharge operation are performed. Then, the conveyance stage 300 on which the power cell 40 is placed is conveyed to the cooling plate 400. The cooling plate 400 is connected to the chiller 800. When the cooling for a predetermined time is completed, nitrogen is introduced from the supply pipe 700. Thereafter, the decompression furnace 200 is opened under the reduced pressure.

In a case where the circuit pattern 44 of the insulating circuit board 41 has a temperature gradient and temperature unevenness near a solder melting temperature when being heated in the heat treatment device 1000, melting starts from a place where the solder melting temperature has been reached firstly. Therefore, a solder flow in which the solder flows out in a direction in which the temperature of the circuit pattern 44 of the insulating circuit board 41 is high is generated. The place where the solder flow occurs is a place close to the heating plate 500 of the heat treatment device 1000 due to the warpage of the insulating circuit board 41.

Figure 5:
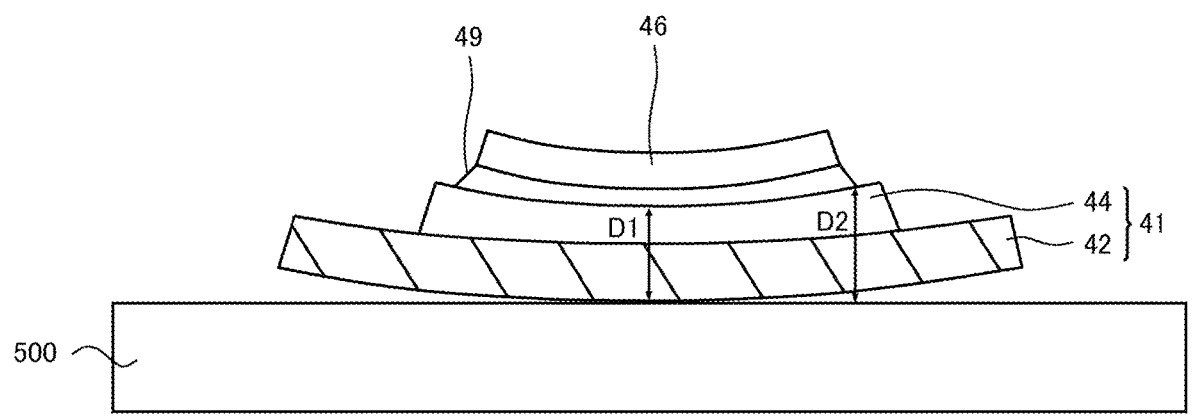
FIG. 5 is a diagram illustrating an example of heat treatment of the power cell 40.

FIG. 5 is a diagram illustrating an example of heat treatment of the power cell 40. As illustrated in FIG. 5, the power cell 40 is placed on the heating plate 500. In this example, the insulating circuit board 41 is warped. Such warpage is caused by a structure in which the semiconductor chip 46, the circuit pattern 44, and the like having a specific warped shape are stacked via a bonding material or the like. In this example, a distance D1 between the heating plate 500 and the solder portion 49 near the center of the insulating circuit board 41 is smaller than a distance D2 between the heating plate 500 and the solder portion 49 near the end of the insulating circuit board 41. Therefore, in the vicinity of the center of the insulating circuit board 41, the temperature is likely to rise as compared with the vicinity of the end of the insulating circuit board 41, and there is a risk that a solder flow occurs. When the solder flow occurs, there is a risk of deterioration in bonding reliability. In addition, in a case where solder flows in a region where wire bonding is performed, there is a concern that wire bondability is deteriorated. Further, when solder flows on a recognition code stamp such as a QR code (registered trademark), there is a concern about a recognition error.

Figure 6:
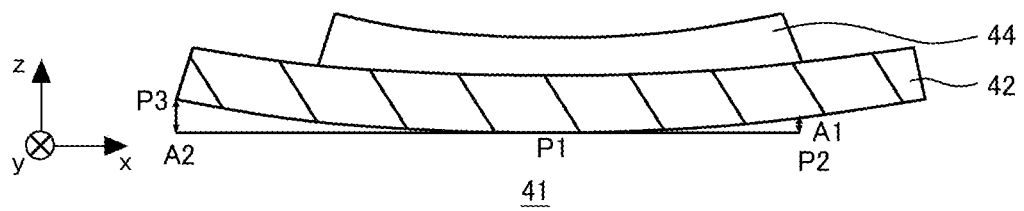
FIG. 6 is a diagram illustrating an example of a warped shape of the insulating circuit board 41.

FIG. 6 is a diagram illustrating an example of a warped shape of the insulating circuit board 41. In this example, the insulating circuit board 41 is warped in a first direction. In FIG. 6, the first direction is the x-axis direction. The warpage of the insulating circuit board 41 in the first direction means that the position of the lower end of the insulating board 42 in the z-axis direction changes when the position of the lower end of the insulating board 42 in the first direction changes. In FIG. 6, when the position of the lower end of the insulating board 42 in the first direction continuously changes, the position of the lower end of the insulating board 42 in the z-axis direction continuously changes. The warpage of the insulating circuit board 41 in the first direction may mean that the position of the upper end of the insulating board 42 in the z-axis direction changes when the position of the upper end of the insulating board 42 in the first direction changes. In this example, a place where the position of the lower end of the insulating board 42 in the z-axis direction is the lowest is defined as a position P1. The position P1 is the center of the insulating circuit board 41 in the first direction. The amount of warpage based on the position P1 is defined as the amount of warpage. The amount of warpage at the position P1 is 0. A position P2 is a position that is an average of the amount of warpage of the insulating circuit board 41 in the x-axis direction. That is, the amount of warpage A1 at the position P2 is the average of the amounts of warpage of the insulating circuit board 41 in the x-axis direction. Further, the position of the end of the insulating circuit board 41 in the first direction is defined as a position P3. The position P3 may be a position where the amount of warpage of the insulating circuit board 41 in the x-axis direction is maximized. The amount of warpage at the position P3 is A2. In FIG. 3, the position P1, the position P2, and the position P3 are indicated by dotted lines.

Since the amount of warpage is 0, the position P1 is the place closest to the heating plate 500 of the heat treatment device 1000. Therefore, in the vicinity of the position P1, the temperature of the insulating circuit board 41 is likely to rise, and a solder flow is likely to occur. In addition, in FIG. 3, a place where the semiconductor chip 46, the conductive block 48, or the lead frame 50 is disposed is less likely to cause a solder flow. The reason why the place where the semiconductor chip 46, the conductive block 48, or the lead frame 50 is disposed is to shield heat emission (radiation) regardless of a distance from the heating plate 500. The transfer of heat is performed in any one of three forms of heat conduction, convection, and heat emission, or a combination thereof. In summary, a solder flow is likely to occur in the vicinity of the position P1 (in the vicinity of the center of the insulating circuit board 41 in the x-axis direction) and at a portion where the semiconductor chip 46, the conductive block 48, or the lead frame 50 is not disposed.

The power cell 40 includes the block-shaped temperature gradient adjustment portion 72. In this example, the power cell 40 includes the temperature gradient adjustment portion 72-1, the temperature gradient adjustment portion 72-2, the temperature gradient adjustment portion 72-3, and the temperature gradient adjustment portion 72-4. The temperature gradient adjustment portion 72 is provided at a place where the semiconductor chip 46, the conductive block 48, or the lead frame 50 is not disposed. The temperature gradient adjustment portion 72 is bonded to the insulating circuit board 41 by silver brazing or the like before the solder portion 49 is melted and bonded in the heat treatment device 1000. The temperature gradient adjustment portion 72 is formed of a metal material applied with an oxide film or a porous ceramic material. As the metal material and the ceramic material constituting the temperature gradient adjustment portion 72, those that do not melt or decompose at a solder melting temperature of 300° C. are used.

The temperature gradient adjustment portion 72 may be formed of a material having a high reflectance of visible light. Specifically, the temperature gradient adjustment portion 72 may be preferable to use a material having a reflectance of visible light of 70% or more, preferably 80% or more, and more preferably 90% or more. As a result, in the reflow furnace, the heat transferred by the heat emission to the vicinity of the place where the temperature gradient adjustment portion 72 is disposed can be reduced. The temperature gradient adjustment portion 72 may be formed of a metal material or a ceramic material having a lower thermal conductivity (W/m·K) than the circuit pattern 44. As a result, heat is less likely to be transferred from the temperature gradient adjustment portion 72 to the vicinity of the place where the temperature gradient adjustment portion 72 is disposed. In addition, the temperature gradient adjustment portion 72 may be formed of a metal material or a ceramic material having a higher volume specific heat ($J/m^3 \cdot K$) than the circuit pattern 44. As a result, since the heat capacity of the temperature gradient adjustment portion 72 becomes relatively high, the temperature is less likely to rise in the vicinity of the place where the temperature gradient adjustment portion 72 is disposed. Therefore, the temperature gradient of the circuit pattern 44 can be relaxed by disposing the temperature gradient adjustment portion 72. Therefore, the solder flow can be reduced. In addition, it is possible to perform bonding while maintaining the solder thickness defined by each solder portion 49, and to secure bonding reliability.

As an aspect in which the temperature gradient adjustment portion 72 is bonded to the insulating circuit board 41, the temperature gradient adjustment portion may be directly or indirectly bonded to the insulating board 42. For example, the temperature gradient adjustment portion 72 may be placed on and directly bonded to the insulating board 42. In addition, the temperature gradient adjustment portion 72 may be bonded to the insulating board 42 via the circuit pattern 44 and indirectly bonded to the insulating board 42.

At least one temperature gradient adjustment portion 72 is disposed at a place where the amount of warpage of the insulating circuit board 41 in the first direction is smaller than the average of the amounts of warpage of the insulating circuit board 41 in the first direction. That is, at least one temperature gradient adjustment portion 72 is disposed closer to the center than the position P2. The position where the temperature gradient adjustment portion 72 is disposed may be the position of the center of gravity of the temperature gradient adjustment portion 72. In this example, all of the temperature gradient adjustment portion 72-1, the entire temperature gradient adjustment portion 72-2, the entire temperature gradient adjustment portion 72-3, and the entire temperature gradient adjustment portion 72-4 are disposed at a place where the amount of warpage of the insulating circuit board 41 in the first direction is smaller than the average of the amounts of warpage of the insulating circuit board 41 in the first direction. The place where the amount of warpage of the insulating circuit board 41 in the first direction is smaller than the average of the amounts of warpage of the insulating circuit board 41 in the first direction is likely to be close to the heating plate 500 of the heat treatment device 1000. Therefore, by disposing the temperature gradient adjustment portion 72 at such a place, the temperature rise is suppressed, and the solder flow is easily reduced.

At least one temperature gradient adjustment portion 72 may be disposed so as to straddle the place (position P1) where the amount of warpage of the insulating circuit board 41 in the first direction is the smallest. As a result, the effect of suppressing the temperature rise and easily reducing the solder flow can be further improved.

At least one of the temperature gradient adjustment portions 72 may be disposed on the center side of the insulating circuit board 41 in the first direction. Disposing on the center side of the insulating circuit board 41 means disposing at a place closer to the center (position P1) of the insulating circuit board 41 as compared with the end portion (for example, position P3) of the insulating circuit board 41 in the first direction. In the vicinity of the center of the insulating circuit board 41, the temperature is likely to rise, and a solder flow is likely to occur. Therefore, by disposing the temperature gradient adjustment portion 72 at such a place, the temperature rise is suppressed, and the solder flow is easily reduced.

The temperature gradient adjustment portion 72 may be formed of a material having a relatively low thermal conductivity. For example, by containing a material having a lower thermal conductivity than copper, the temperature of the place where the temperature gradient adjustment portion 72 is disposed can be less likely to rise. The thermal conductivity (W/m·K) of the material included in the temperature gradient adjustment portion 72 may be 300 W/m·K or less. The temperature gradient adjustment portion 72 may appropriately contain different materials.

The temperature gradient adjustment portion may be formed of a material having a relatively low thermal conductivity (W/m·K). The heat treatment device 1000 such as a reflow furnace not only conducts heat from the lower surface of the power cell 40 but also transfers heat from the upper surface of the power cell 40 or the like by heat emission. Therefore, heat transferred from the upper surface of the power cell 40 or the like can be further reduced by relatively lowering the thermal conductivity (W/m·K) of the temperature gradient adjustment portion 72. The thermal conductivity (W/m·K) of the temperature gradient adjustment portion 72 may be 300 W/m·K or less. The thermal conductivity (W/m·K) of the temperature gradient adjustment portion 72 may be 200 W/m·K or less. The thermal conductivity (W/m·K) of the temperature gradient adjustment portion 72 may be 30 W/m·K or less. The thermal conductivity (W/m·K) of the circuit pattern 44 is, for example, 400 W/m·K.

The temperature gradient adjustment portion 72 may be made of a material having a relatively high volume specific heat (J/m³·K). The volume specific heat (J/m³·K) is a value obtained by multiplying the specific heat capacity (J/Kg·K) by the density (Kg/m³). With such a configuration, the solder flow can be reduced. The volume specific heat of the temperature gradient adjustment portion 72 may be 2000 kJ/m³·K or more, preferably 3000 kJ/m³·K or more, further preferably 3500 kJ/m³·K or more, and most preferably 4000 kJ/m³·K or more. The volume specific heat of the circuit pattern 44 is, for example, 3400 kJ/m³·K.

The temperature gradient adjustment portion 72 may be made of a material having a lower solder wettability than the circuit pattern 44. That is, the temperature gradient adjustment portion 72 may be formed of a material that hardly allows the solder to spread. Examples of the material having a lower solder wettability than the circuit pattern 44 include ceramics, aluminum, an alloy containing aluminum, iron, or an alloy containing iron.

At least one of the temperature gradient adjustment portions 72 may have a longitudinal side in the first direction. In this example, the temperature gradient adjustment portion 72-1, the temperature gradient adjustment portion 72-2, and the temperature gradient adjustment portion 72-3 have a long side in the x-axis direction. Since the temperature gradient adjustment portion 72 has a long side in the first direction, warpage occurring in the first direction can be suppressed.

Figure 7:
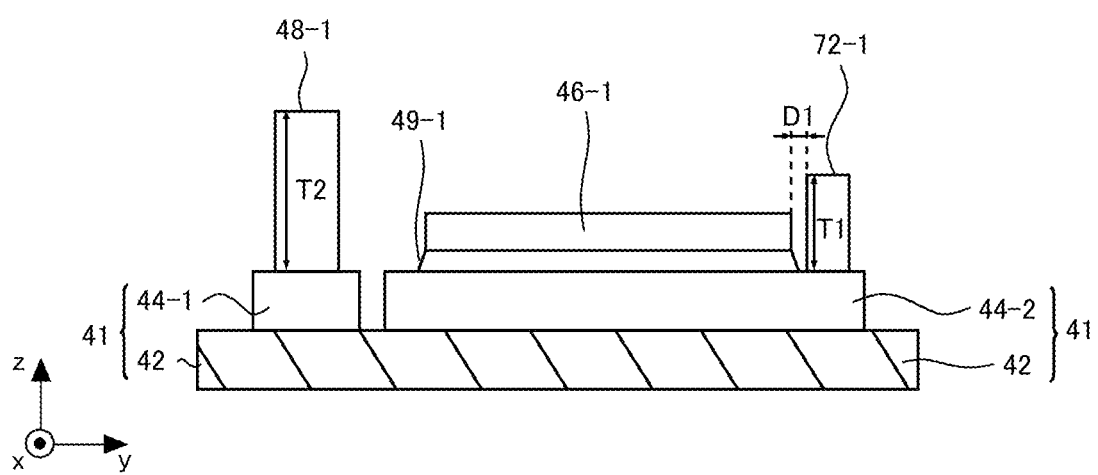
FIG. 7 is a diagram illustrating an example of an A-A cross section of FIG. 3.

FIG. 7 is a diagram illustrating an example of an A-A cross section of FIG. 3. FIG. 7 is a cross section passing through the semiconductor chip 46-1. In this cross section, the power cell 40 includes the insulating board 42, the circuit pattern 44, the semiconductor chip 46, the conductive block 48, the solder portion 49, and the temperature gradient adjustment portion 72.

The height T1 of the temperature gradient adjustment portion 72 may be lower than the height T2 of the conductive block 48. By making the height of the temperature gradient adjustment portion 72 lower than the height of the conductive block 48, it is possible to prevent the temperature gradient adjustment portion 72 and the terminal 64 from coming into contact with each other. Therefore, the solder flow can be reduced while preventing the temperature gradient adjustment portion 72 from interfering with other members.

The temperature gradient adjustment portion 72 may be disposed away from the solder portion 49. Since the temperature gradient adjustment portion 72 is disposed away from the solder portion 49, a solder fillet can be easily formed. Further, the effect of forming a good solder fillet can be improved by forming the temperature gradient adjustment portion 72 with a material having a lower solder wettability than the circuit pattern 44. At least one surface of the temperature gradient adjustment portion 72 may be preferably disposed to face at least one surface of the solder portion 49. The shortest distance D1 between the temperature gradient adjustment portion 72 and the semiconductor chip 46 may be 500 μm or more. The shortest distance D1 between the temperature gradient adjustment portion 72 and the semiconductor chip 46 may be 1 mm or less. The temperature gradient adjustment portion 72 and the solder portion 49 can be disposed away from each other by setting the shortest distance D1 between the temperature gradient adjustment portion 72 and the semiconductor chip 46 from 500 μm to 1 mm. The temperature gradient adjustment portion 72 may or may not be in contact with the conductive block 48.

In one example, the temperature gradient adjustment portion 72 may be formed of aluminum or an alloy thereof. Aluminum has a lower solder wettability and a lower thermal conductivity than copper constituting the circuit pattern 44. In addition, since aluminum is a material having conductivity, it is also possible to constitute a part of the circuit wiring. In a case where such a conductive material is superimposed on the circuit pattern 44, and thus capacitance affects the circuit pattern, the conductive temperature gradient adjustment portion 72 may be placed on the circuit pattern 44 with an insulating material interposed therebetween.

The insulating board 42 may not be warped in the y-axis direction as a second direction. In this example, the insulating board 42 is warped only in the x-axis direction. Further, the insulating board 42 may be warped in the y-axis direction as the second direction. In this case, the temperature gradient adjustment portion 72 may be preferably disposed at a position lower than the average amount of warpage in each of the first direction and the second direction. Note that the above description of the case of having warpage in the first direction may also be applied to the case of having warpage in the second direction.

Figure 8:
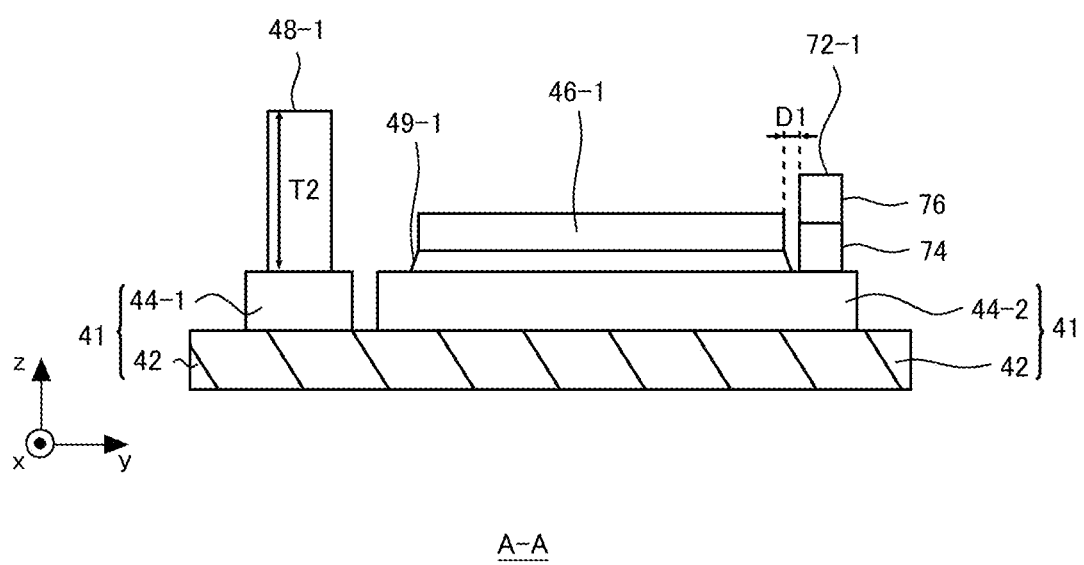
FIG. 8 is a diagram illustrating another example of the A-A cross section of FIG. 3.

FIG. 8 is a diagram illustrating another example of the A-A cross section of FIG. 3. FIG. 8 is different from FIG. 7 in the configuration of the temperature gradient adjustment portion 72. Other configurations in FIG. 8 may be the same as those in FIG. 7.

At least one temperature gradient adjustment portion 72 includes a first portion 74 and a second portion 76. In this example, the temperature gradient adjustment portion 72-1 includes the first portion 74 and the second portion 76. The second portion 76 is provided on the upper surface of the first portion 74.

The volume specific heat (J/m³·K) of the first portion 74 may be higher than the volume specific heat (J/m³·K) of the second portion 76. The thermal conductivity (W/m·K) of the second portion 76 may be lower than the thermal conductivity (W/m·K) of the first portion 74. Specifically, the first portion 74 contains copper, and the second portion 76 contains aluminum or ceramics. With such a configuration, it is possible to increase the reflectance on the upper surface of the temperature gradient adjustment portion 72, reduce the heat conducted from the upper surface side of the temperature gradient adjustment portion 72, increase the heat capacity, and reduce the temperature rise of the insulating circuit board 41.

Figure 9:
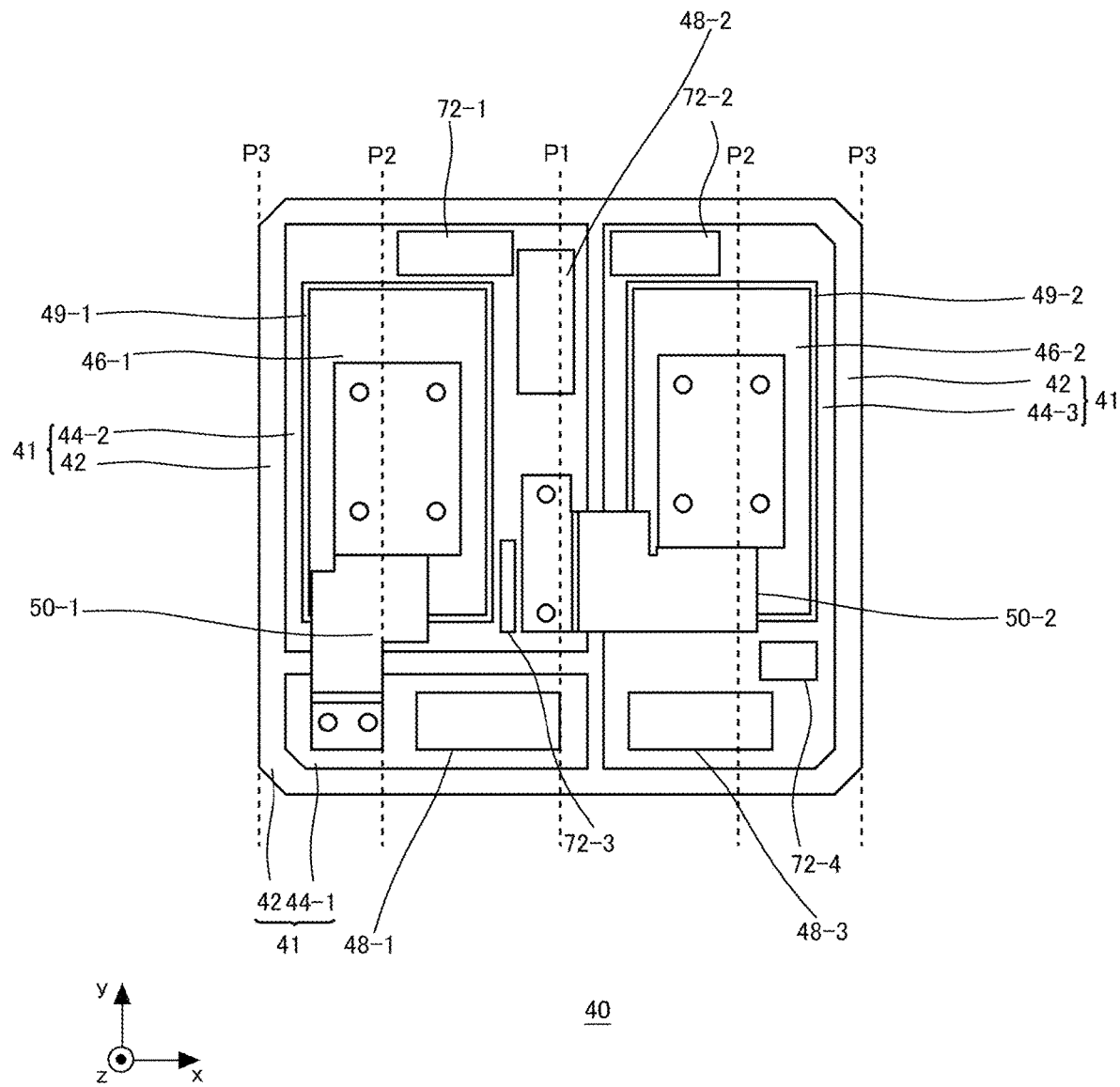
FIG. 9 is a diagram illustrating another example of the power cell 40 in a top view.

FIG. 9 is a diagram illustrating another example of the power cell 40 in a top view. FIG. 9 is different from FIG. 3 in the configuration of the temperature gradient adjustment portion 72. Other configurations in FIG. 9 may be the same as those in FIG. 3.

In FIG. 9, the temperature gradient adjustment portion 72-4 is disposed outside the position P2. That is, the entire temperature gradient adjustment portion 72-4 is disposed at a place where the amount of warpage of the insulating circuit board 41 in the first direction is larger than the average amount of warpage of the insulating circuit board 41 in the first direction. Also in such a configuration, the solder flow can be reduced. In this example, the temperature gradient adjustment portion 72-4 is referred to as a second temperature gradient adjustment portion. The temperature gradient adjustment portion 72-1, the temperature gradient adjustment portion 72-2, and the temperature gradient adjustment portion 72-3 are referred to as first temperature gradient adjustment portions.

The volume of the temperature gradient adjustment portion 72-1 or the temperature gradient adjustment portion 72-2 (the volume of the first temperature gradient adjustment portion) may be larger than the volume of the temperature gradient adjustment portion 72-4 (the volume of the second temperature gradient adjustment portion). The place where the second temperature gradient adjustment portion is disposed has a large warpage of the insulating circuit board 41 and is less likely to rise in temperature, so that the solder flow is less likely to occur than the place where the first temperature gradient adjustment portion is disposed. Therefore, by making the volume of the first temperature gradient adjustment portion smaller than the volume of the second temperature gradient adjustment portion, it is possible to prevent the temperature gradient adjustment portion 72-4 from interfering with other members while preventing the solder flow.

In the above-described embodiment, the temperature gradient adjustment portion 72 may be disposed in a block shape, a flat plate shape, an elliptical shape, or the like. Here, the size and the volume of the temperature gradient adjustment portion 72 may be set so as to correct the temperature gradient of the solder portion 49 and the circuit pattern 44, desirably to eliminate the temperature gradient, based on variables such as area, thickness, thermal conductivity, and temperature difference of the surface of the circuit pattern 44 at the time of heating of the semiconductor chip 46.

In the above-described embodiment, it is assumed that the semiconductor chip 46 and the solder portion 49 are disposed at a place smaller than the average amount of warpage of the insulating circuit board 41 in the first direction and the second direction. This is because in a case where the semiconductor chip 46 and the solder portion 49 are not disposed at a place having an average amount of warpage smaller than the insulating circuit board 41, temperature unevenness is relatively less likely to occur in the solder portion 49, and thus it is more effective to dispose the semiconductor chip 46 and the solder portion 49 at a place having an average amount of warpage smaller than the insulating circuit board 41 as in this example. However, in a case where the semiconductor chip 46 and the solder portion 49 are not disposed at a place having the average amount of warpage smaller than the insulating circuit board 41 in the first direction and the second direction, the temperature gradient adjustment portion 72 may be disposed at a place having a larger average of the amount of warpage to implement a countermeasure similar to this example.

Although the present invention has been described using the embodiments, the technical scope of the present invention is not limited to the scope described in the above embodiments. It is apparent to those skilled in the art that various modifications or improvements can be made to the above embodiments. It is apparent from the description of the claims that modes to which such changes or improvements are added can also be included in the technical scope of the present invention.

What is claimed is:

1. A semiconductor module comprising:
   an insulating circuit board, including an insulating board and a conductive circuit pattern provided on an upper surface of the insulating board;
   a semiconductor chip provided above the insulating circuit board;
   a solder portion for bonding the circuit pattern and the semiconductor chip; and
   one or more temperature gradient adjustment portions configured to be bonded to the insulating circuit board and have at least one surface disposed to face at least one surface of the solder portion,
   wherein
   the insulating circuit board is warped in a first direction, and
   at least one of the temperature gradient adjustment portions is disposed at a place where an amount of warpage of the insulating circuit board in the first direction is smaller than an average amount of warpage of the insulating circuit board in the first direction.

2. The semiconductor module according to claim 1, wherein
   the temperature gradient adjustment portion is formed of a metal material or a ceramic material having a lower thermal conductivity (W/m·K) than the circuit pattern.

3. The semiconductor module according to claim 2, wherein
   the temperature gradient adjustment portion is formed of a metal material or a ceramic material having a higher volume specific heat (J/m³·K) than the circuit pattern.

4. The semiconductor module according to claim 2, wherein
   the temperature gradient adjustment portion is formed of a metal material or a ceramic material having a lower solder wettability than the circuit pattern.

5. The semiconductor module according to claim 2, wherein
   the temperature gradient adjustment portion does not constitute a part of a circuit wiring.

6. The semiconductor module according to claim 2, wherein
   the temperature gradient adjustment portion contains aluminum.

7. The semiconductor module according to claim 2, wherein
the circuit pattern contains copper.

8. The semiconductor module according to claim 1, wherein
the temperature gradient adjustment portion is formed of a metal material or a ceramic material having a higher volume specific heat (J/m$^3$·K) than the circuit pattern.

9. The semiconductor module according to claim 1, wherein
the temperature gradient adjustment portion is formed of a metal material or a ceramic material having a lower solder wettability than the circuit pattern.

10. The semiconductor module according to claim 1, wherein
the temperature gradient adjustment portion does not constitute a part of a circuit wiring.

11. The semiconductor module according to claim 1, wherein
the temperature gradient adjustment portion contains aluminum.

12. The semiconductor module according to claim 1, wherein
the circuit pattern contains copper.

13. The semiconductor module according to claim 1, further comprising:
a resin case configured to surround a space that accommodates the insulating circuit board; and
a sealing resin configured to contains an epoxy resin and be filled in the resin case.

14. The semiconductor module according to claim 1, further comprising:
a terminal connected to an external wiring; and
a conductive block provided above the insulating circuit board and electrically connected to the terminal,
wherein a height of the temperature gradient adjustment portion is lower than a height of the conductive block.

15. The semiconductor module according to claim 1, wherein
at least one of the temperature gradient adjustment portions is disposed on a center side of the insulating circuit board in the first direction.

16. The semiconductor module according to claim 1, wherein
the temperature gradient adjustment portion is disposed away from the solder portion.

17. The semiconductor module according to claim 16, wherein
a shortest distance between the temperature gradient adjustment portion and the semiconductor chip is from 500 μm to 1 mm.

18. The semiconductor module according to claim 1, wherein
at least one of the temperature gradient adjustment portions has a long side in the first direction.

19. The semiconductor module according to claim 1, comprising:
a plurality of the temperature gradient adjustment portions,
wherein
at least one of the temperature gradient adjustment portions is a first temperature gradient adjustment portion disposed at a place where an amount of warpage of the insulating circuit board in the first direction is smaller than an average amount of warpage of the insulating circuit board in the first direction,
at least one of the temperature gradient adjustment portions is a second temperature gradient adjustment portion disposed at a place where an amount of warpage of the insulating circuit board in the first direction is larger than an average amount of warpage of the insulating circuit board in the first direction, and
a volume of the first temperature gradient adjustment portion is larger than a volume of the second temperature gradient adjustment portion.

20. The semiconductor module according to claim 1, wherein
at least one of the temperature gradient adjustment portions includes:
a first portion; and
a second portion provided on an upper surface of the first portion,
a volume specific heat (J/m$^3$·K) of the first portion is higher than a volume specific heat (J/m$^3$·K) of the second portion, and
a thermal conductivity (W/m·K) of the second portion is lower than a thermal conductivity (W/m·K) of the first portion.

* * * * *